(12) United States Patent
Qiao et al.

(10) Patent No.: US 11,169,422 B2
(45) Date of Patent: Nov. 9, 2021

(54) PIXEL STRUCTURE, DISPLAY PANEL, MANUFACTURING AND CONTROL METHOD THEREOF

(71) Applicants: Hefei Xinsheng Optoelectronics Technology Co., Ltd., Hefei (CN); BOE TECHNOLOGY GROUP CO., LTD., Beijing (CN)

(72) Inventors: Xuanxuan Qiao, Beijing (CN); Shuai Liu, Beijing (CN); Xianfeng Yuan, Beijing (CN); Hongjun Wang, Beijing (CN); Yuanyuan Liu, Beijing (CN); Min Wang, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/639,512

(22) PCT Filed: Aug. 19, 2019

(86) PCT No.: PCT/CN2019/101392
§ 371 (c)(1),
(2) Date: Feb. 14, 2020

(87) PCT Pub. No.: WO2020/082864
PCT Pub. Date: Apr. 30, 2020

(65) Prior Publication Data
US 2021/0063797 A1    Mar. 4, 2021

(30) Foreign Application Priority Data

Oct. 26, 2018 (CN) .......................... 201811257391.X

(51) Int. Cl.
*G02F 1/1343* (2006.01)
*G02F 1/1333* (2006.01)
(Continued)

(52) U.S. Cl.
CPC ........ *G02F 1/13439* (2013.01); *G02F 1/1339* (2013.01); *G02F 1/1341* (2013.01);
(Continued)

(58) Field of Classification Search
CPC ........... G02F 1/133512; G02F 1/13439; G02F 1/1339; G02F 2202/36; G02F 2202/32; G02F 1/1341; G02F 1/133377
See application file for complete search history.

(56) References Cited

U.S. PATENT DOCUMENTS 8,238,022 B2   8/2012   Joo et al.
8,537,453 B2   9/2013   Joo et al.
(Continued)

FOREIGN PATENT DOCUMENTS

CN   101084459 A   12/2007
CN   102422213 A   4/2012
(Continued)

OTHER PUBLICATIONS

The International Search Report Issued in Application No. PCT/CN2019/101392 dated Nov. 25, 2019, (13p).
(Continued)

*Primary Examiner* — Mariam Qureshi
(74) *Attorney, Agent, or Firm* — Arch & Lake LLP

(57) ABSTRACT

A display panel is disclosed. The display panel includes a plurality of pixel structures, each of the pixel structures including: a first electrode being a transparent electrode; a second electrode in substantially parallel arrangement with respect to the first electrode; a retaining wall between the first electrode and the second electrode, and enclosing a (Continued)

sealed cavity together with the first electrode and the second electrode; and a target liquid in the sealed cavity containing a plurality of particles, and the plurality of particles being configured to form photonic crystals with different lattice spacing under an action of different electric fields between the first electrode and the second electrode.

20 Claims, 10 Drawing Sheets

(51) Int. Cl.
    *G02F 1/1335*     (2006.01)
    *G02F 1/1339*     (2006.01)
    *G02F 1/1341*     (2006.01)

(52) U.S. Cl.
    CPC .. *G02F 1/133377* (2013.01); *G02F 1/133512* (2013.01); *G02F 2202/32* (2013.01); *G02F 2202/36* (2013.01)

(56) References Cited

U.S. PATENT DOCUMENTS

| | | | |
|---|---|---|---|
| 10,529,290 B1* | 1/2020 | Parsons | H01L 33/502 |
| 2004/0227455 A1* | 11/2004 | Moon | G02F 1/21 |
| | | | 313/501 |
| 2008/0230752 A1* | 9/2008 | Bower | B82Y 20/00 |
| | | | 252/584 |
| 2012/0188295 A1* | 7/2012 | Joo | G02F 1/1685 |
| | | | 345/690 |
| 2012/0293858 A1* | 11/2012 | Telfer | G02F 1/16757 |
| | | | 359/296 |
| 2013/0050620 A1 | 2/2013 | Shin et al. | |
| 2014/0124369 A1 | 5/2014 | Han et al. | |
| 2016/0291401 A1* | 10/2016 | Cheng | G02F 1/1339 |

FOREIGN PATENT DOCUMENTS

| | | |
|---|---|---|
| CN | 102955315 A | 3/2013 |
| CN | 106255920 A | 12/2016 |
| CN | 108153041 A | 6/2018 |
| CN | 109061936 A | 12/2018 |
| EP | 1326132 A2 | 7/2003 |
| KR | 20140007161 A | 1/2014 |

OTHER PUBLICATIONS

First Office Action to Chinese Application No. 201811257391.X, dated Apr. 28, 2020 with English translation (18p).

* cited by examiner

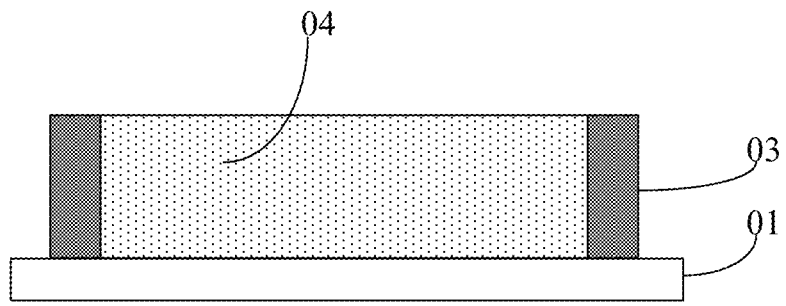
Fig. 7
Adjusting an electric field formed between the first electrode and the second electrode by adjusting voltages applied to the first electrode and the second electrode in the pixel structure to adjust lattice spacing of the photonic crystal formed by the particles of the target liquid in the pixel structure — 801
Fig. 8
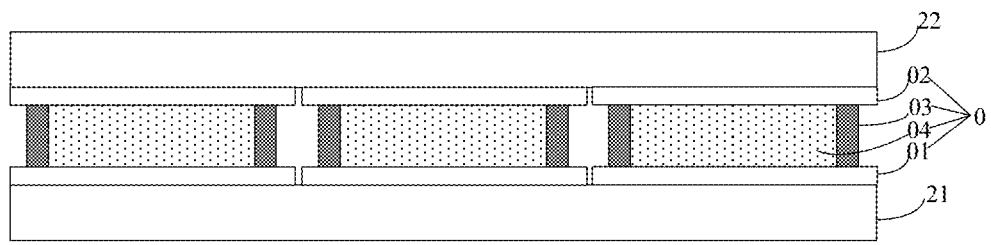
Fig. 9

PIXEL STRUCTURE, DISPLAY PANEL, MANUFACTURING AND CONTROL METHOD THEREOF

CROSS-REFERENCE TO RELATED APPLICATIONS

This application is the U.S. national phase of PCT Patent Application No. PCT/CN2019/101392 filed on Aug. 19, 2019, which claims the priority of Chinese Patent Application No. 201811257391.X, filed on Oct. 26, 2018, the entire content of both of which is incorporated herein by reference in their entirety for all purposes.

TECHNICAL FIELD

The present application relates to the field of display technology, and in particular, to a pixel structure, a display panel, a method of manufacturing and controlling the same.

BACKGROUND

With the development of the display technology, various display panels have been developed, such as a liquid crystal display (LCD) panel and an organic light-emitting diode (OLED) display panel.

In the related art, both the liquid crystal display panel and the OLED display panel comprise a plurality of pixel structures arranged in an array, and each of the pixel structures is capable of emitting light of a fixed color such as red, green or blue. By adjusting the brightness of the light emitted by each pixel structure, the display panel can display an image.

However, each pixel structure in the display panel of the related art is only capable of emitting light of a fixed color.

SUMMARY

According to a first aspect of the present disclosure, there is provided a display panel, comprising a plurality of pixel structures, each of the pixel structures comprising: a first electrode being a transparent electrode; a second electrode in substantially parallel arrangement with respect to the first electrode; a retaining wall between the first electrode and the second electrode, and enclosing a sealed cavity together with the first electrode and the second electrode; and a target liquid in the sealed cavity containing a plurality of particles, and the plurality of particles being configured to form photonic crystals with different lattice spacing under an action of different electric fields between the first electrode and the second electrode.

According to a second aspect of the present disclosure, there is provided a method of manufacturing a display panel, the display panel comprising a plurality of pixel structures, the method comprising: providing a first electrode and a second electrode, at least one of the first electrode and the second electrode being a transparent electrode; forming a retaining wall on the first electrode, wherein the retaining wall and the first electrode together form a receiving recess; injecting a target liquid into the receiving recess; and placing the second electrode on the retaining wall to seal the receiving recess and thereby forming a sealed cavity, and the target liquid being within the sealed cavity; wherein the target liquid contains a plurality of particles, and the plurality of particles are configured to form photonic crystals with different lattice spacing under an action of different electric fields between the first electrode and the second electrode.

BRIEF DESCRIPTION OF THE DRAWINGS

A more particular description of the embodiments will be rendered by reference to specific embodiments illustrated in the appended drawings. Given that these drawings depict only some embodiments and are not therefore considered to be limiting in scope, the embodiments will be described and explained with additional specificity and details through the use of the accompanying drawings, in which:

FIG. 7 is a schematic diagram of a manufacturing process of another pixel structure according to an embodiment;

FIG. 8 is a flowchart of a method for controlling a pixel structure according to an embodiment;

FIG. 9 is a schematic structural diagram of a display panel according to an embodiment;

DETAILED DESCRIPTION

Figure 1:
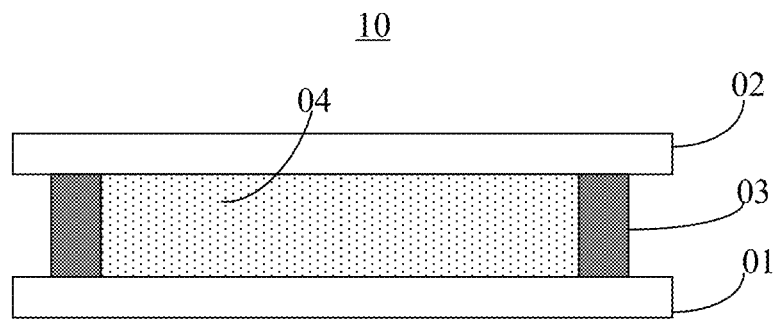
FIG. 1 is a schematic diagram of a pixel structure according to an embodiment.

The disclosure will be described hereinafter with reference to the accompanying drawings, which illustrate embodiments of the disclosure. The described embodiments are only exemplary embodiments of the present disclosure, but not all embodiments. Other variations may be derivable by a person of ordinary skill in the art based on the embodiments of the present disclosure without creative efforts, and are within the scope of the present disclosure.

References throughout the disclosure to "one embodiment", "an embodiment", "an example", "some embodiments", or similar language mean that a particular feature, structure, or characteristic described in connection with the embodiment is included in at least one embodiment. Thus, appearances of the phrases "in one embodiment", "in an embodiment", "in some embodiments", and similar language throughout the disclosure may, but do not necessarily, all refer to the same embodiment(s), but mean "one or more embodiments". These may or may not include all the embodiments disclosed. Accordingly, features or elements of some embodiments may be available in some other embodiments unless the context indicates otherwise.

Unless otherwise defined, technical terms or scientific terms used in the embodiments of the present disclosure should be construed in the ordinary meaning of the person of ordinary skill in the art.

The terms "first", "second" and similar terms used in the present disclosure do not denote any order, quantity, or importance. They are merely used for references to relevant devices, components, procedural steps, etc. These terms do not imply any spatial or chronological orders, unless expressly specified otherwise. For example, a "first device" and a "second device" may refer to two separately formed devices, or two parts or components of the same device. In some cases, for example, a "first device" and a "second device" may be identical, and may be named arbitrarily. Similarly, a "first step" of a method or process may be carried or performed before, after, or simultaneously with, a "second step".

The terms "comprising", "including", "having", and variations thereof mean "including but not limited to", unless expressly specified otherwise.

An enumerated listing of items does not imply that any or all of the items are mutually exclusive, unless expressly specified otherwise. The terms "a", "an", and "the" also refer to "one or more" unless expressly specified otherwise.

The words "connected" or "connection" and the like are not limited to physical or mechanical connections, but may include electrical connections, whether direct or indirect.

The word "over" is used only to indicate that a layer's relative position with respect to another layer, which means that the layer is located further from the substrate than the other. This does not necessarily require contact of the two layers, nor does it require the layer fully or partially covering the other layer.

The words "above", "below", "under", "upper", "lower", "left", "right", etc. may be used to refer to relative positions of an element under normal operation mode or installation orientation, to facilitate understanding of the relevant embodiments. The scope of the disclosure is not limited to the specific operation mode or installation orientation as described.

In a pixel structure according to an embodiment of the present disclosure, the first electrode, the second electrode and the retaining wall enclose a sealed structure, and the target liquid is contained in the sealing structure. The particles in the target liquid can form photonic crystals with different lattice spacing under an action of an electric field, and the wavelengths of the light diffracted by the photonic crystals with different lattice spacing are different, so that the color of the light emitted by each pixel structure is enriched.

The liquid crystal display panel and the OLED display panel are two common types of display panels, each of which includes a plurality of pixel structures, for example, a pixel structure in the liquid crystal display panel including a pixel electrode, and a pixel structure in the OLED display panel including an OLED. Since each pixel structure in the two types of the display panels can only emit light of a fixed color (such as red, green or blue), the display panels are less flexible.

In addition, electronic paper having a paper-like display effect is also a common display panel. For example, the electronic paper includes a plurality of pixel structures, and each of the pixel structures may include: a first electrode and a second electrode disposed opposite to each other, and a capsule between the two electrodes. The capsule encapsulates positively charged white particles, as well as negatively charged black particles. When it is required to control the pixel structure to display black on the side where the first electrode is located, a positive voltage may be applied to the first electrode and a negative voltage may be applied to the second electrode to move the black particles in the capsule to the first electrode, and to move the white particles to the second electrode. When it is required to control the pixel structure to display white on the side where the first electrode is located, a negative voltage may be applied to the first electrode and a positive voltage may be applied to the second electrode to move the white particles in the capsule to the first electrode, and to move the black particles to the second electrode. However, since the pixel structure in the electronic paper can only display two colors of white and black, the display effect of the electronic paper is poor.

Some embodiments of the disclosure provide a pixel structure that emits light of adjustable-color.

According to some embodiments, a pixel structure may include a first electrode being a transparent electrode; a second electrode in substantially parallel arrangement with respect to the first electrode; a retaining wall between the first electrode and the second electrode, and enclosing a sealed cavity together with the first electrode and the second electrode; and a target liquid in the sealed cavity containing a plurality of particles, and the plurality of particles being configured to form photonic crystals with different lattice spacing under an action of different electric fields between the first electrode and the second electrode.

For example, FIG. 1 is a schematic diagram of a pixel structure according to an embodiment. As shown in FIG. 1, the pixel structure 10 may include: a first electrode 01, a second electrode 02, a retaining wall 03, and a target liquid 04.

The first electrode 01 and the second electrode 02 are oppositely disposed, and at least one of the first electrode 01 and the second electrode 02 is a transparent electrode. For example, the first electrode 01 is a transparent electrode and the second electrode 02 is a non-transparent electrode, or the first electrode 01 is a non-transparent electrode and the second electrode 02 is a transparent electrode, or both the first electrode 01 and the second electrode 02 are transparent electrodes. Optionally, the transparent electrode may be made of indium tin oxide.

The retaining wall 03 may be annular and located between the first electrode 01 and the second electrode 02 and enclose a sealed cavity with the first electrode 01 and the second electrode 02. The target liquid 04 is located in the sealed cavity or sealed chamber, and a plurality of particles are present in the target liquid 04. The plurality of particles are used to form photonic crystals having different lattice spacing under the action of different electric fields formed between the first electrode 01 and the second electrode 02.

It should be noted that a photonic crystal is a structure formed by a plurality of particles arranged periodically, and the photonic crystal is similar to a submicroscopic structure having a structural color in nature. In the natural world, many organisms display multiple colors. Most organisms (such as vegetables, fruits, etc.) show different colors due to chemical pigments. Some organisms (such as bird feathers, insect wings, colored gemstones, shells, etc.) show colors because of an optical effect caused by their submicroscopic structures. This color development mechanism is physical color development, called structural color. The structural color is independent of the coloration of the pigment, and is a variety of colors produced by refraction, scattering, diffraction, or interference of light on the periodic structure of the living body. The structural color has the advantages of never fading, environmental friendly and having iridescent effect.

After light is incident on the photonic crystal from a first side of the photonic crystal, the photonic crystal is capable of diffracting the light and emitting light from the first side of the photonic crystal. Light of a certain wavelength emitted from the first side has a much higher proportion than light of other wavelengths (the light of the certain wavelength can be called the main diffracted light of the photonic crystal on the first side, and the color of the light emitted by the first side of the photonic crystal perceived by human eyes is the color of the light of this wavelength). The first side may be either side of the photonic crystal. Moreover, the wavelength of light obtained by diffraction on the photonic crystal is related to the lattice spacing of the photonic crystal. In some embodiments, different electric fields are formed between the first electrode 01 and the second electrode 02, so that the particles in the photonic crystal can be moved by the electric fields, thereby changing the arrangement of the plurality of particles in the photonic crystal, and accordingly changing the lattice spacing of the photonic crystal to change the wavelength of the light obtained by diffraction on the photonic crystal, so that the light obtained by diffracting on the photonic crystal changes.

For example, when the first electrode 01 is a transparent electrode and the second electrode 02 is a non-transparent electrode, the photonic crystal formed by the particles in the target liquid 04 can diffract the light incident from a side of the first electrode 01 that is away from the second electrode 02. The diffracted light is emitted from the side of the first electrode of the pixel structure such that the side of the first electrode of the pixel structure emits light.

When the first electrode 01 is a non-transparent electrode and the second electrode 02 is a transparent electrode, the photonic crystal formed by the particles in the target liquid 04 can diffract the light incident from a side of the second electrode 02 that is away from the first electrode 01. The diffracted light is emitted from the side of the second electrode of the pixel structure such that the side of the second electrode of the pixel structure emits light.

When the first electrode 01 and the second electrode 02 are both transparent electrodes, the photonic crystal formed by the particles in the target liquid 04 can diffract light of a certain wavelength in the light incident from a side of the first electrode 01 that is away from the second electrode 02. The diffracted light is emitted from the side of the first electrode in the pixel structure, so that the side of the first electrode in the pixel structure emits light. The photonic crystal formed by the particles in the target liquid 04 is also capable of diffracting light of a certain wavelength of light incident from the side of the second electrode 02 that is away from the first electrode 01. The diffracted light is emitted from the side of the second electrode in the pixel structure, so that the side of the second electrode in the pixel structure emits light.

In summary, in the pixel structure, the first electrode, the second electrode and the retaining wall enclose a sealed structure or a sealed cavity, and the target liquid is contained in the sealed structure. The particles in the target liquid can form photonic crystals with different lattice spacing under the action of an electric field, and the wavelengths of the light diffracted by the photonic crystals with different lattice spacing are different, so that the color of the light emitted by each pixel structure is enriched.

For example, the photonic crystal can diffract light based on the principle of Bragg diffraction. Assuming that the wavelength of the light that the photonic crystal can diffract is λ, λ satisfies the following formula:

$$\lambda = 2dn_{\textit{eff}} = \left(\frac{\pi}{3\sqrt{2}\,\varphi}\right)^{\frac{1}{3}}\left(\frac{8}{3}\right)^{\frac{1}{2}} D(n_p^2\varphi + n_m^2(1-\varphi))^{\frac{1}{2}};$$

where d is the lattice spacing, $n_{\textit{eff}}$ is the effective refractive index, π is the pi, φ represents the volume fraction of the particles in the photonic crystal (e.g., the volume fraction of the particles in the target liquid), D is the diameter of the particles, and $n_p$ is the refractive index of the particles in the photonic crystal, $n_m$ is the refractive index of the medium (such as the solvent of the target liquid). From this formula, it can be concluded that by adjusting parameters other than λ (such as d, $n_{\textit{eff}}$, D, $n_p$, $n_m$, etc.) in the formula, λ can be changed, so as to change the wavelength of light diffracted by the photonic crystal, and changes of these intrinsic parameters can be achieved by external changes, such as external temperature, chemical environment, pressure, magnetic field or electric field, etc. In the embodiment, the electric field external to the photonic crystal is changed, thereby changing the lattice spacing of the photonic crystal, and accordingly changing the wavelength of the light obtained by the photonic crystal diffraction.

Optionally, the particles in the target liquid may be charged or uncharged as long as the particles are able to move under the action of different electric fields formed between the first electrode 01 and the second electrode 02, thereby causing the plurality of particles to form photonic crystals of different lattice spacing. Optionally, the particles may be positively or negatively charged when the particles are charged.

Optionally, the particles of the target liquid may include: monodisperse particles having a highly uniform size, shape, chemical composition, internal structure, and surface properties, and thus are an ideal material for forming a photonic crystal.

For example, the monodisperse particles may include: ferroferric oxide nanoparticles (negatively charged), titanium dioxide nanoparticles, or ferroferric oxide nanoparticles coated with titanium dioxide, etc. In practical applications, the monodisperse particles may also be other monodisperse particles, such as micron particles.

Optionally, the solvent of the target liquid may include: propylene carbonate or water. In practical applications, the solvent may also be other liquids. It should be noted that the solute in the target liquid is a particle for forming a photonic crystal, and the particles in the target liquid are not dissolved in the solvent of the target liquid. Therefore, the target liquid may be referred to as a suspension of the particles.

Optionally, the mass fraction of the particles in the target liquid may range from 2.5% (percent) to 25%, for example, the mass fraction of the particles in the target liquid is 2.5%, 5%, 10%, 15%, 20% or 25% or so on. For example, when the monodisperse particles include ferroferric oxide nanoparticles, and the solvent of the target liquid includes propylene carbonate, the mass fraction of the particles in the target liquid can be set to 5%.

In an example, the target liquid comprises a suspension of ferroferric oxide nanoparticles in propylene carbonate, with a mass fraction in a range of 2% to 10%, preferably in a range of 3% to 7%, or more preferably of approximately 5%. A suspension of other concentrations may also be used, e.g., 12.5%, 15%, 20%, or even 30%, to achieve a desirable display result.

In another example, the target liquid comprises a suspension of ferroferric oxide nanoparticles coated with titanium dioxide in propylene carbonate. A mass fraction of the ferroferric oxide nanoparticles coated with titanium dioxide in the suspension is in a range of 2% to 10%, preferably in a range of 3% to 8%, or more preferably of approximately 5%. Similarly, a suspension of other concentrations may be used as well, e.g., 12.5%, 15%, 20%, or even 30%, to achieve a desirable display result.

Figure 2:
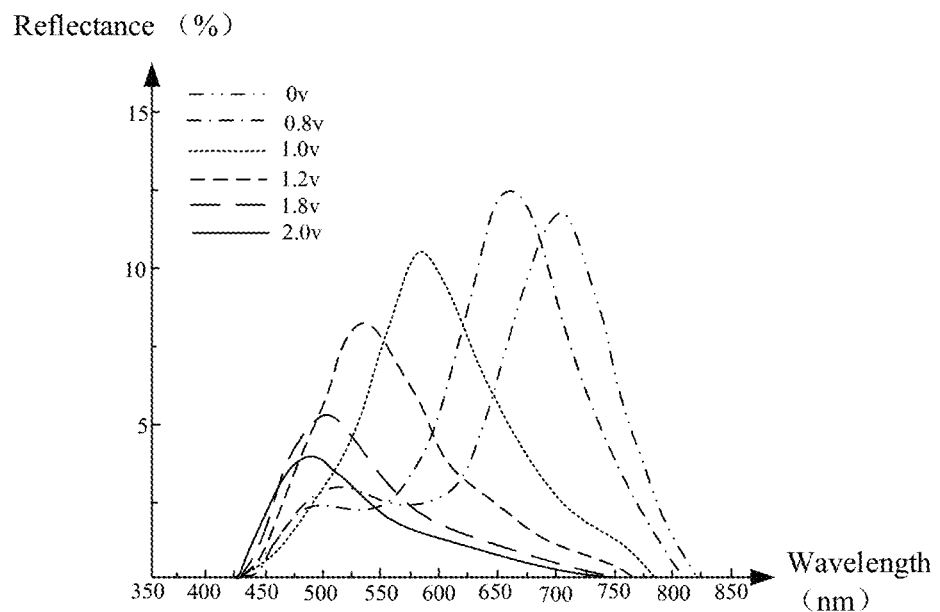
FIG. 2 is a schematic diagram showing the relationships among wavelength, reflectance and electric potential difference according to an embodiment.

FIG. 2 shows the wavelength of light diffracted by the photonic crystal formed with particles in the target liquid near the side of the first electrode when the potential difference between the first electrode and the second electrode is 0 v (volts), 0.8 v, 1.0 v, 1.2 v, 1.8 v, and 2.0 v, respectively, with a pixel structure in which the monodisperse particles include ferroferric oxide nanoparticles, the solvent of the target liquid includes propylene carbonate, and the mass fraction of the particles in the target liquid is 5%, and assuming the voltage on the first electrode is greater than the voltage on the second electrode. The horizontal axis of FIG. 2 represents the wavelength of light diffracted on the side of the photonic crystal close to the first electrode, and the vertical axis of FIG. 2 represents the reflectance of light obtained by the photonic crystal diffraction in the photonic crystal near the side of the first electrode. It should be noted that light incident from one side of the photonic crystal can be diffracted by the photonic crystal, and the diffracted light is emitted from this side of the photonic crystal. It can be seen that light is equivalently reflected on a photonic crystal, and in the light emitted from the photonic crystal after reflection, the side of the photonic crystal close to the first electrode has a much higher reflectance with respect to light of a certain wavelength than the other. The light of the certain wavelength is the light mainly diffracted by the photonic crystal. It should be noted that the reflectance of light of each wavelength on one side of the photonic crystal may be: the ratio of the luminous flux of the light of the wavelength emitted from one side to the luminous flux of all the light incident on the side.

As shown in FIG. 2, as the potential difference between the first electrode and the second electrode increases, the particle spacing of the photonic crystal on the side close to the first electrode decreases, and the wavelength of the light obtained by diffraction (that is, the wavelength of the light having the highest diffraction rate under a potential difference) on the side of the photonic crystal near the first electrode changes significantly, for example, among the light diffracted by the photonic crystal, the light having the highest reflectance on the side of the photonic crystal near the first electrode changes from red to green, and then to blue. The wavelength of the light diffracted by the photonic crystal on the side close to the first electrode ranges from 480 nm to 720 nm. In addition, the wavelength of light that the human eyes can perceive is between 400 nm and 760 nm. Therefore, the photonic crystal can substantially emit light of various colors that the human eyes can perceive on the side close to the first electrode.

For example, Table 1 shows the relationship between the potential difference and the wavelength in FIG. 2, the potential difference being the potential difference between the first electrode and the second electrode, and the wavelength being the wavelength of the light having the highest reflectance on the side of the photonic crystal close to the first electrode among the light diffracted by the photonic crystal.

TABLE 1

| Potential Difference (v) | 0 | 0.8 | 1.0 | 1.2 | 1.8 | 2.0 |
|---|---|---|---|---|---|---|
| Wavelength (nm) | 720 | 660 | 590 | 540 | 510 | 480 |

As shown in Table 1, assuming that the voltage on the first electrode is greater than, or equal to, the voltage on the second electrode, when the potential difference between the first electrode and the second electrode is 0 v, among the light obtained by the photonic crystal diffraction, the light having the highest reflectance on the side of the photonic crystal close to the first electrode has a wavelength of 720 nm (wavelength of red light); when the potential difference between the first electrode and the second electrode is 0.8 v, among the light obtained by the photonic crystal diffraction, the light having the highest reflectance on the side of the photonic crystal close to the first electrode has a wavelength of 660 nm (wavelength of deep orange light); when the potential difference between the first electrode and the second electrode is 1.0 v, among the light obtained by the photonic crystal diffraction, the light having the highest reflectance on the side of the photonic crystal close to the first electrode has a wavelength of 590 nm (wavelength of light orange light); when the potential difference between the first electrode and the second electrode is 1.2 v, among the light obtained by the photonic crystal diffraction, the light having the highest reflectance on the side of the photonic crystal close to the first electrode has a wavelength of 540 nm (the wavelength of yellow light); when the potential difference between the first electrode and the second electrode is 1.8 V, among the light obtained by the photonic crystal diffraction, the light having the highest reflectance on the side of the photonic crystal close to the first electrode has a wavelength of 510 nm (wavelength of green light); when the potential difference between the first electrode and the second electrode is 2.0 v, among the light obtained by the photonic crystal diffraction, the light having the highest reflectance on the side of the photonic crystal close to the first electrode has a wavelength of 480 nm (wavelength of dark blue light). That is, among the light obtained by the photonic crystal diffraction, the light having the highest reflectance on the side of the photonic crystal close to the first electrode changes from red to green, and then to blue.

In addition, as the potential difference between the first electrode and the second electrode increases, the particle spacing of the photonic crystal on the side close to the second electrode increases, and the light diffracted by the photonic crystal on the side near the second electrode changes from red to brown, and then to red again.

Figure 3:
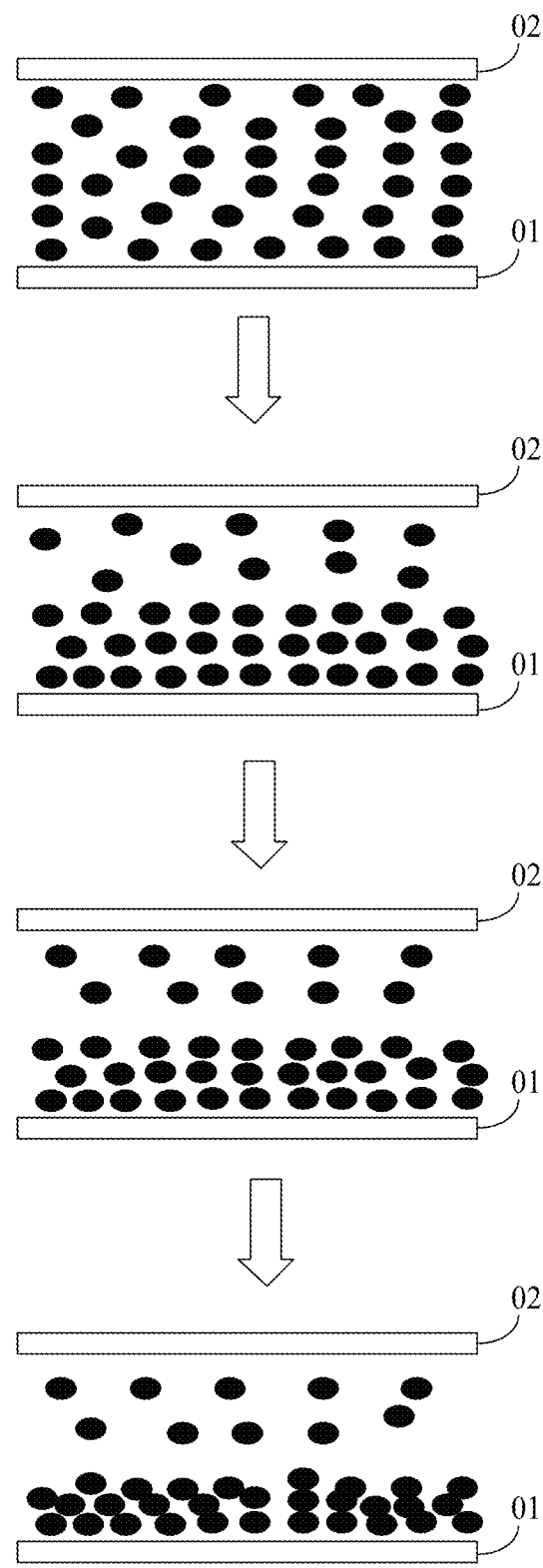
FIG. 3 is a schematic diagram of particles moving under an action of an electric field according to an embodiment.

For example, as shown in FIG. 3, assuming that the voltage on the first electrode is greater than the voltage on the second electrode, the direction of the electric field in the pixel structure is the direction in which the first electrode 01 faces the second electrode 02, i.e. from the first electrode 01 towards the second electrode 02. It should be noted that four pixel structures are shown in FIG. 3, and the potential difference between the first electrode 01 and the second electrode 02 sequentially increases from the top to the bottom in the four pixel structures.

When the potential difference between the first electrode 01 and the second electrode 02 is the smallest (for example, the voltage difference is 0 volt), the negatively charged ferroferric oxide nanoparticles are uniformly dispersed in the target liquid. The surface of the ferroferric oxide nanoparticles is negatively charged, and the ferroferric oxide nanoparticles are arranged in an ordered structure under the action or effect of the electric field force and the interaction among the particles. Here, among the light diffracted by the photonic crystal formed by the particles in the target liquid, the light having the highest reflectance on the side of the photonic crystal near the first electrode has a large wavelength (for example, 720 nm).

As the pressure difference increases, the electric field force between the first electrode 01 and the second electrode 02 increases, and the ferroferric oxide nanoparticles aggregate under the electric field force toward the side of the first electrode 01. The spacing between the ferroferric oxide nanoparticles is reduced, and the wavelength of the light diffracted by the side of the photonic crystal formed by the particles in the target liquid near the first electrode 01 is blue-shifted. It can be observed that the light having the highest reflectance on the side of the photonic crystal near the first electrode, among the light obtained by the photonic crystal diffraction, changes from red to green, and to blue.

On the side of the photonic crystal near the second electrode 02, as the electric field force between the first electrode 01 and the second electrode 02 increases, the spacing between the ferroferric oxide nanoparticles on the side of the photonic crystal near the second electrode 02 increases. Among the light diffracted by the photonic crystal on the side close to the second electrode 02, the light having the highest reflectance on the side of the photonic crystal near the second electrode is red; as the pressure difference continues to increase, under the action of the electric field force and the inter-forces among the particles, the ferroferric oxide nanoparticles are arranged in an ordered structure on the side of the photonic crystal close to the second electrode 02, and the wavelength of the light diffracted on the side of the photonic crystal close to the second electrode 02 is a wavelength of the brown light; as the potential difference continues to increase, the ferroferric oxide nanoparticles are further moved closer to the second electrode 02, and the spacing of the ferroferric oxide nanoparticles is decreased on the side of the photonic crystal close to the second electrode 02. The wavelength of the light obtained by the diffraction becomes a wavelength of red light again; therefore, it can be observed that the light diffracted on the side close to the second electrode 02 in the photonic crystal changes from red to brown, and to red.

Optionally, the pixel structure 10 may further include: a first adhesive between the retaining wall 03 and the first electrode 01, and a second adhesive between the retaining wall 03 and the second electrode 02. The retaining wall 03 is bonded to the first electrode 01 by the first adhesive and to the second electrode 02 by the second adhesive.

It should be noted that, since the pixel structure according to the embodiment is a reflective pixel structure, the pixel structure may use ambient light to emit light without specifically setting a backlight for the pixel structure, so the pixel structure is energy-efficient. Moreover, since the pixel structure uses ambient light to emit light, the brightness of the light emitted by the pixel structure is similar to the brightness of the ambient light. Therefore, the display effect of the display panel in which the pixel structure is located is similar to that of the paper. Optionally, the light emitting side of the pixel structure according to the embodiment may also be provided with a light source, which may provide ambient light for the pixel structure.

Optionally, when the first electrode 01 and the second electrode 02 are both transparent electrodes, the side of the first electrode 01 of the pixel structure and the side of the second electrode 02 are each capable of emitting light of a wavelength, so that the pixel structure can emit light at both the side where the electrode 01 is located and the side where the second electrode 02 is located.

Since the color of the light emitted from the side where the first electrode and the second electrode are located is related to the voltages applied to the first electrode and the second electrode, when a set of voltages is applied to the first electrode and the second electrode, the side of the first electrode in the pixel structure emits light of a first color, and the side of the second electrode of the pixel structure emits light of a second color. The voltages applied to the first electrode and the second electrode may be exchanged as needed, to control the pixel structure to emit light of the second color from the side of the first electrode, and to emit light of the first color on the side of the first electrode.

The material of the retaining wall may be polyimide, and the height of the retaining wall (the height direction is perpendicular to the first electrode) may be 200 micrometers.

The first electrode and the second electrode may be insulated from each other. For example, in an embodiment, the material of at least one of the first adhesive, the retaining wall and the second adhesive may be made of an insulating material to achieve the insulating effect between the first electrode and the second electrode. For example, the first adhesive, the second adhesive, and the retaining wall are made of an insulating material; or the first adhesive is made of an insulating material, and the retaining wall and the second adhesive are not made of an insulating material; or the second adhesive is made of an insulating material, and the material of the retaining wall and the first adhesive is not an insulating material; or the retaining wall is made of an insulating material, and the first adhesive and the second adhesive are not made of an insulating material. It should be noted that the material of at least one of the first adhesive, the retaining wall and the second adhesive is an insulating material, and other arrangements may be possible.

In summary, in the pixel structure, the first electrode, the second electrode and the retaining wall enclose a sealed structure, and the target liquid is contained in the sealed structure. The particles in the target liquid can form photonic crystals with different lattice spacing under the action of an electric field, and the wavelengths of the light diffracted by the photonic crystals with different lattice spacing are different, so that the color of the light emitted by each pixel structure is enriched.

Figure 4:
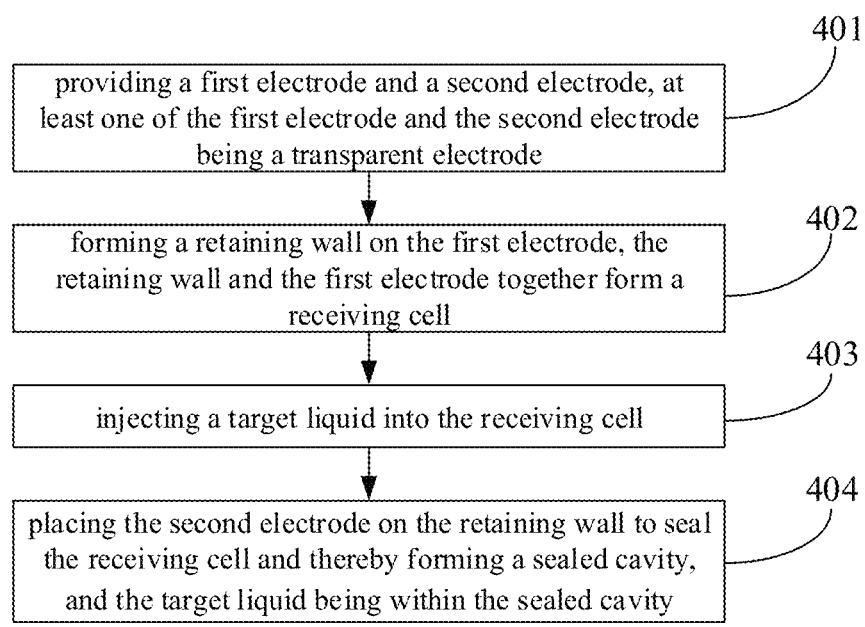
FIG. 4 is a flowchart of a method for manufacturing a pixel structure according to an embodiment.

FIG. 4 is a flowchart of a method for manufacturing a pixel structure according to an embodiment. The pixel structure may be a pixel structure shown in FIG. 1. As shown in FIG. 4, the method for manufacturing the pixel structure may include:

Step 401: providing a first electrode and a second electrode, at least one of the first electrode and the second electrode being a transparent electrode.

Step 402: forming a retaining wall on the first electrode, the retaining wall forming a receiving recess with the first electrode.

Step 403: injecting a target liquid into the receiving recess.

Step 404: placing the second electrode on the retaining wall to seal the receiving recess to form a sealed cavity, and the target liquid being located in the sealed cavity.

The particles in the target liquid are used to form photonic crystals of different lattice spacing under the action of different electric fields formed between the first electrode and the second electrode.

In summary, in the pixel structure manufactured by the method according to the embodiment, the first electrode, the second electrode and the retaining wall enclose a sealed structure or sealed cavity, and the sealed cavity contains a target liquid. The particles in the target liquid can form photonic crystals with different lattice spacing under the action of an electric field, and the wavelengths of the light diffracted by the photonic crystals with different lattice spacing are different, so that the color of the light emitted by each pixel structure is enriched.

Figure 5:
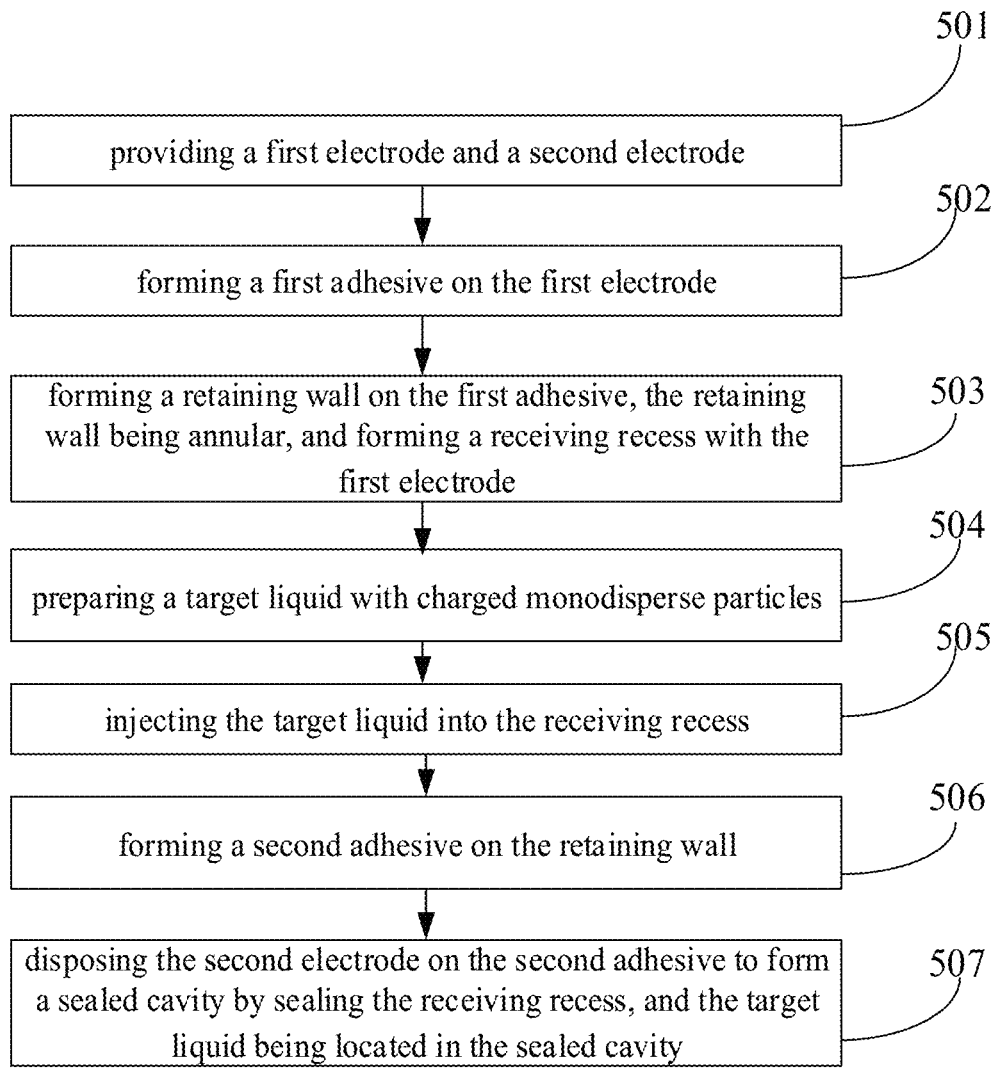
FIG. 5 is a flowchart of another method for manufacturing a pixel structure according to an embodiment.

FIG. 5 is a flowchart of another method for manufacturing pixel structure according to an embodiment. The pixel structure may be a pixel structure shown in FIG. 1. As shown in FIG. 5, the method for manufacturing the pixel structure may include:

Step 501: providing a first electrode and a second electrode.

For example, separate first and second electrodes can be fabricated directly, and the first and second electrodes can each be in the form of a sheet. Optionally, a first electrode may be formed on a first substrate, and a second electrode may be formed on a second substrate. In this case, step 501 is to provide the first substrate on which the first electrode is formed and to provide the second substrate on which the second electrode is formed.

At least one of the first electrode and the second electrode is a transparent electrode.

Step 502: forming a first adhesive on the first electrode.

For example, the first adhesive may be formed on a region of the first electrode 01 where the retaining wall is to be formed. The first adhesive can be a photoresist, and the first adhesive can be formed in a manner of exposure and development.

For example, a photoresist may be coated on the first electrode, and then the photoresist is exposed by using a mask to form a fully exposed region and a non-exposed region, and then processed by a development process. The photoresist in the fully exposed region is removed, and the photoresist in the non-exposed region remains, thereby resulting in the first adhesive.

Step 503: forming a retaining wall on the first adhesive, the retaining wall being annular, and forming a receiving recess with the first electrode.

Figure 6:
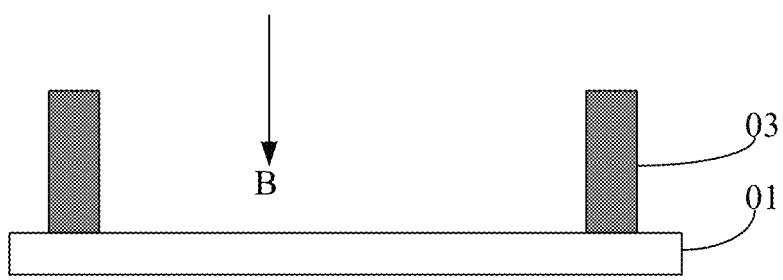
FIG. 6 is a schematic diagram of a manufacturing process of a pixel structure according to an embodiment.

After forming the first adhesive, as shown in FIG. 6, an annular retaining wall 03 can be formed on the first adhesive by one patterning process, and the retaining wall 03 is adhered to the first electrode 01 by the first adhesive.

For example, by coating, magnetron sputtering, thermal evaporation or plasma enhanced chemical vapor deposition (PECVD), and etc., an insulating material is deposited on the first substrate on which the first adhesive is formed to form an insulating material layer, and then the insulating material layer is processed by one patterning process to obtain a retaining wall. Here, one patterning process includes: photoresist coating, exposure, development, etching, and photoresist stripping. Therefore, processing the insulating material layer by using one patterning process includes: coating a layer of photoresist on the insulating material layer, exposing the photoresist by using a mask to form the fully exposed and non-exposed areas of the photoresist, and then processing by a development process to remove the photoresist in the fully exposed area, in which the photoresist in the non-exposed area is retained, and subsequently etching the corresponding area of the insulating material layer in the fully exposed area. After the etching is completed, the photoresist in the non-exposed area is removed to obtain the retaining wall.

After the retaining wall 03 is formed, the retaining wall 03 and the first electrode 01 can form a receiving recess B as shown in FIG. 6. The bottom surface of the receiving recess B is formed by the first electrode 01, and the side of the receiving recess B is formed by the retaining wall 03.

Step 504: preparing a target liquid with charged monodisperse particles.

The particles in the target liquid are used to form photonic crystals with different lattice spacing under different electric fields. For example, charged ferroferric oxide nanoparticles, titanium dioxide nanoparticles, or titanium oxide-coated ferroferric oxide nanoparticles may be mixed with propylene carbonate or water to prepare the target liquid. Optionally, when the charged ferroferric oxide nanoparticles are mixed with propylene carbonate, the mass fraction of the particles in the target liquid may be set to 5%.

Step 505: injecting the target liquid into the receiving recess.

After the receiving recess B is formed and the target liquid 04 is prepared, as shown in FIG. 7, the target liquid 04 may be injected into the receiving recess B by means of a syringe, or other means.

Step 506: forming a second adhesive on the retaining wall.

After the target liquid is injected into the receiving recess, the second adhesive can be formed on the retaining wall 03. The second adhesive can be formed in the same manner as the first adhesive, and the second adhesive can be of the same material as the first adhesive, which will not be described herein.

Step 507: disposing the second electrode on the second adhesive to form a sealed cavity by sealing the receiving recess, and the target liquid being located in the sealed cavity.

After the second adhesive is formed, the second electrode 02 provided in step 501 may be disposed or fastened on the second adhesive (e.g., the second substrate on which the second electrode 02 is formed is placed on the second adhesive, and the second electrode 02 is located on the side of the second substrate near to the second adhesive) to obtain the pixel structure shown in FIG. 1.

The particles in the target liquid are used to form photonic crystals having different lattice spacing under the effect of different electric fields between the first electrode and the second electrode.

In summary, in the pixel structure manufactured by the method according to the embodiment, the first electrode, the second electrode and the retaining wall enclose a sealed structure, and the sealed structure contains the target liquid. The particles in the target liquid can form photonic crystals with different lattice spacing under the action of an electric field, and the wavelengths of the light diffracted by the photonic crystals with different lattice spacing are different, so that the color of the light emitted by each pixel structure may be enriched.

FIG. 8 is a flowchart of a method for controlling a pixel structure according to an embodiment. The method is used to control the pixel structure shown in FIG. 1. The controlling method may be performed by a control device of a display panel. The control device may be connected to both the first electrode and the second electrode of the pixel structure. As shown in FIG. 8, the control method of the pixel structure may include:

Step 801: adjusting an electric field formed between the first electrode and the second electrode by adjusting voltages applied to the first electrode and the second electrode in the pixel structure to adjust lattice spacing of the photonic crystal formed by the particles of the target liquid or target suspension in the pixel structure.

For example, when the control device of the display panel needs to control the pixel structure to emit light of a first color, the control device of the display panel may apply a first group of voltages to the first electrode and the second electrode (including voltages applied to the first electrode and the second electrode), respectively, such that the lattice spacing of the photonic crystal formed by the particles is of a first interval or distance, and the pixel structure emits light of the first color by diffraction.

When the control device of the display panel needs to control the pixel structure to emit light of a second color, the control device of the display panel may respectively apply a second group of voltages to the first electrode and the second electrode (including voltages applied to the first electrode and applied to the second electrode), such that the lattice spacing of the photonic crystal formed by the particles is of a second interval or distance, and the pixel structure emits light of the second color by diffraction.

That is, the color of the light emitted by the pixel structure is related to the voltages applied to the first electrode and the second electrode, and by adjusting the voltages applied to the first electrode and the second electrode, color adjustment of the light emitted by the pixel structure can be realized.

In summary, since the first electrode, the second electrode and the retaining wall in the pixel structure enclose a sealed structure, and the target liquid is contained in the sealed structure, the particles in the target liquid can form photonic crystals with different lattice spacing under the effect of an electric field, and the wavelengths of the light diffracted by the photonic crystals with different lattice spacing are different. Therefore, in the method for controlling the pixel structure according to the embodiment, the lattice spacing of the photonic crystal formed by the particles in the pixel structure can be adjusted by adjusting the voltages applied to the first electrode and the second electrode in the pixel structure. Thus, the color of the light emitted by each pixel structure can be enriched.

FIG. 9 is a schematic structural diagram of a display panel according to an embodiment. As shown in FIG. 9, the display panel 2 may include: a first substrate 21 and a second substrate 22 disposed opposite to each other, and a pixel structure 0 disposed between the first substrate 21 and the second substrate 22. The pixel structure 0 may be a pixel structure shown in FIG. 1.

For example, a plurality of pixel structures 0 may be disposed in an array between the first substrate 21 and the second substrate 22. In FIG. 9, the display panel includes three pixel structures 0 as an example. Optionally, the display panel may further include other numbers of pixel structures, such as 100, 200, and the like.

Figure 10:
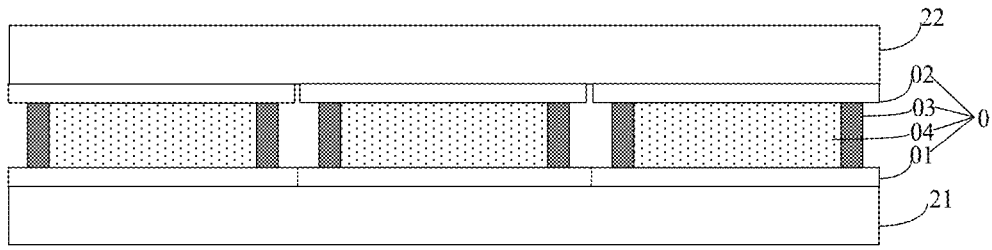
FIG. 10 is a schematic structural diagram of another display panel according to an embodiment.

Optionally, in FIG. 9, the first electrodes 01 of the plurality of pixel structures are insulated from each other as an example. Optionally, FIG. 10 is a schematic structural diagram of another display panel according to an embodiment. As shown in FIG. 10, the first electrodes in all the pixel structures of the display panel may also be an integrated structure, and the second electrodes of any two pixel structures in the display panel are insulated from each other.

In summary, in the pixel structure of the display panel according to the embodiment, the first electrode, the second electrode, and the retaining wall enclose a sealed structure, and the target liquid is contained in the sealed structure. The particles in the target liquid can form photonic crystals with different lattice spacing under the effect of an electric field; and the wavelengths of the light diffracted by the photonic crystals with different lattice spacing are different, so that the color of the light emitted by each pixel structure can be enriched.

In some embodiments, the retaining wall is of a same material as black matrix. The material may be Chromium (Cr), carbon black, or black porous resin composition having Titanium dioxide particles, or any combinations thereof. Other suitable materials available to an ordinary skilled person in the art may also be used to form the retaining wall.

Figure 20:
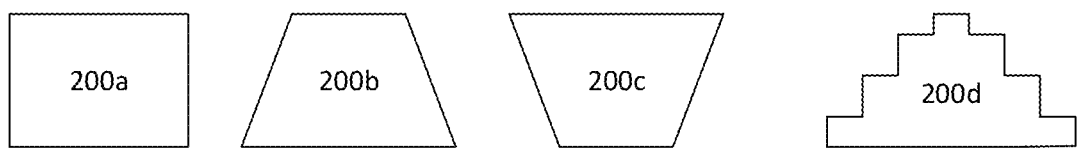
FIG. 20 is a schematic diagram illustrating cross-sectional shapes of a retaining wall of a pixel structure according to some embodiments.

The retaining wall may be formed of various shapes. For example, in some embodiments as shown in FIG. 20, the retaining wall may have a cross-sectional shape of a rectangle 200a, a trapezoid 200b, an inverted trapezoid 200c, or an area with stepped sides 200d.

Figure 11:
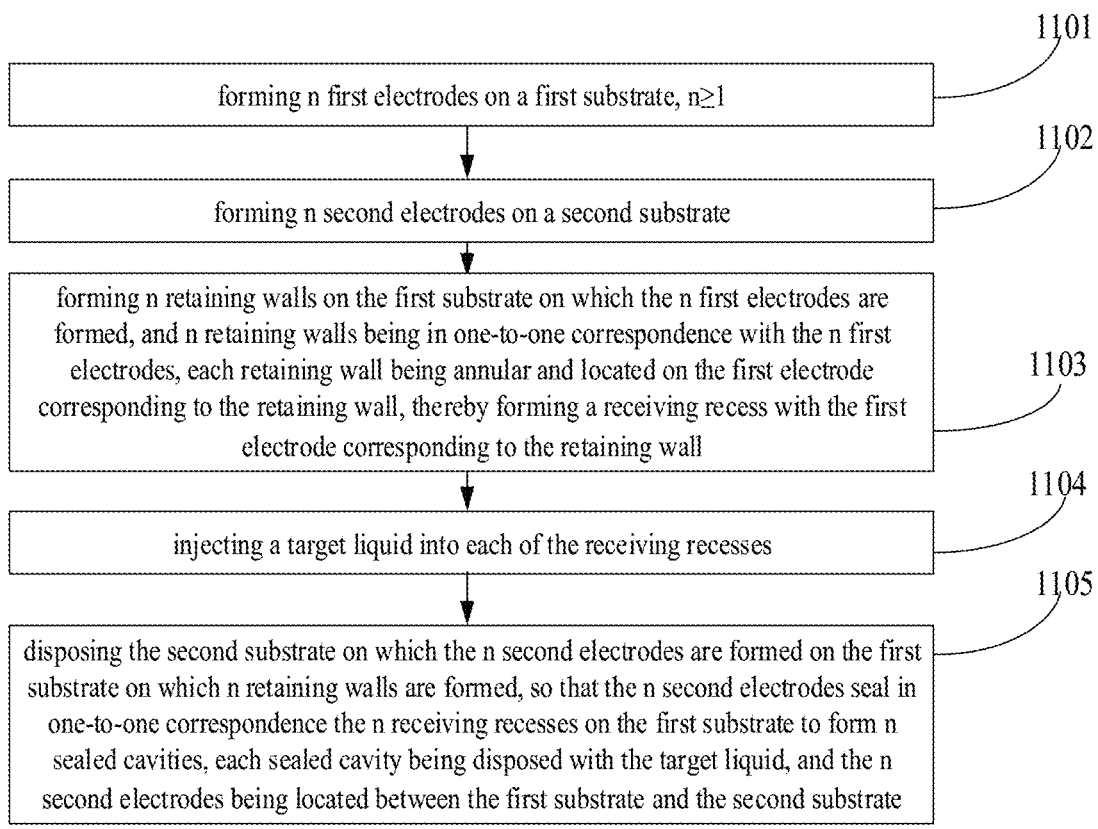
FIG. 11 is a flowchart of a method for manufacturing a display panel according to an embodiment.

FIG. 11 is a flowchart of a method for manufacturing a display panel according to an embodiment, which may be used to manufacture a display panel shown in FIG. 9 or FIG. 10. As shown in FIG. 11, the manufacturing method includes:

Step 1101: forming n first electrodes on a first substrate, where n is an integer and n≥1.

Step 1102: forming n second electrodes on a second substrate.

Step 1103: forming n retaining walls on the first substrate on which then first electrodes are formed, and n retaining walls being in one-to-one correspondence with the n first electrodes, each retaining wall being annular and located on the first electrode corresponding to the retaining wall, thereby forming a receiving recess with the first electrode corresponding to the retaining wall.

Step 1104: injecting a target liquid into each of the receiving recesses.

Step 1105: disposing the second substrate, on which the n second electrodes are formed, on the first substrate on which the n retaining walls are formed, so that the n second electrodes seal in one-to-one correspondence the n receiving recesses on the first substrate to form n sealed cavities, each sealed cavity being disposed with the target liquid, and the n second electrodes being located between the first substrate and the second substrate.

A plurality of particles are present in the target liquid in each sealed cavity, and the plurality of particles are used to form photonic crystals with different lattice spacing under different electric fields caused by the first electrode and the second electrode that form the sealed cavity.

In summary, in the pixel structure of the display panel manufactured by the method according to the embodiment, the first electrode, the second electrode and the retaining wall enclose a sealed structure or a sealed cavity, and the sealed structure includes a target liquid. The particles in the target liquid form photonic crystals with different lattice spacing under the effect of an electric field, and the wavelengths of the light diffracted by the photonic crystals with different lattice spacing are different, so that the color of the light emitted by each pixel structure can be enriched.

Figure 12:
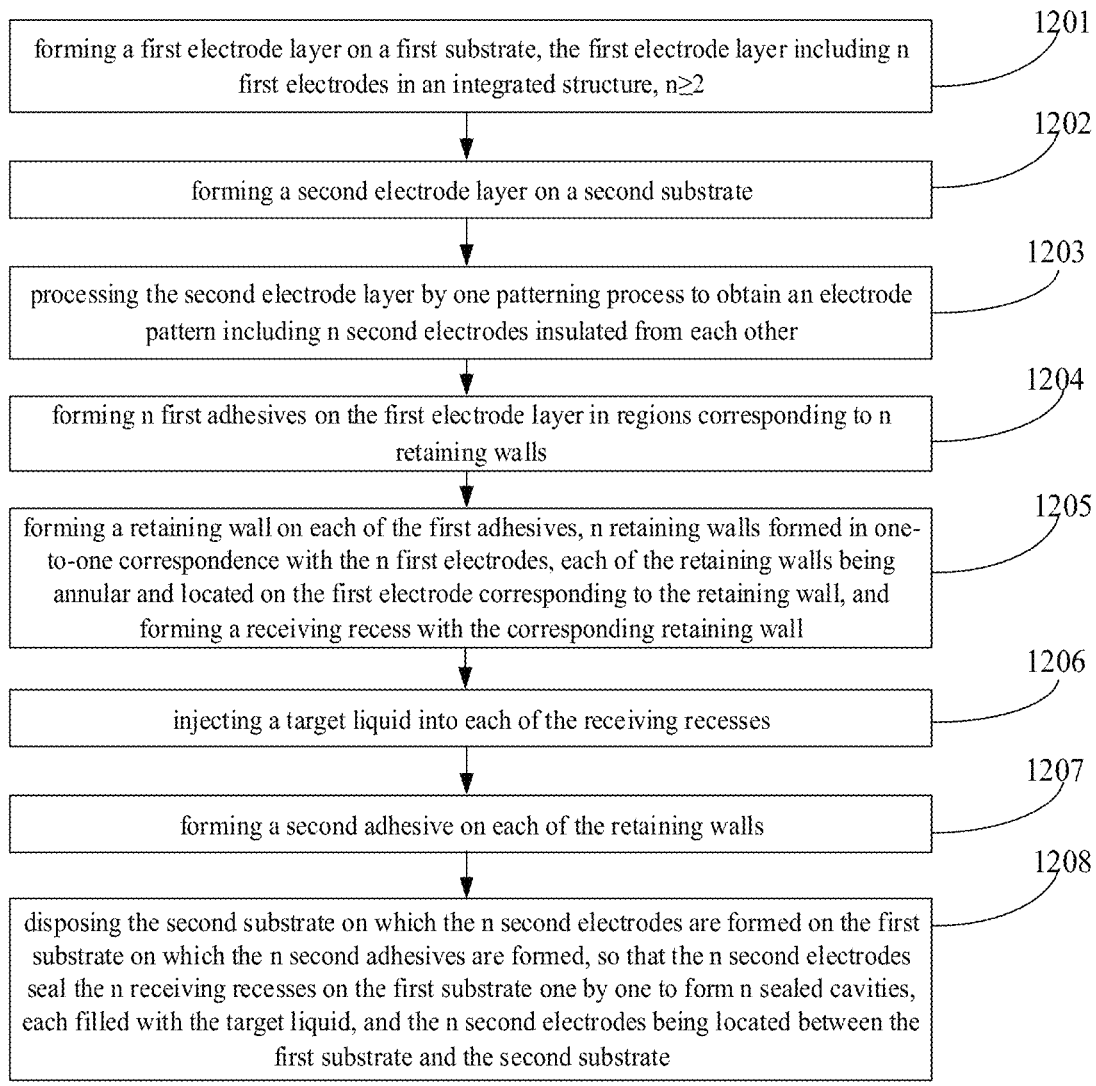
FIG. 12 is a flowchart of another method for manufacturing a display panel according to an embodiment.

FIG. 12 is a flow chart of another method for manufacturing a display panel according to an embodiment. The method may be used to manufacture the display panel shown in FIG. 12. As shown in FIG. 12, the manufacturing method includes:

Step 1201: forming a first electrode layer on a first substrate, the first electrode layer including n first electrodes in an integrated structure, n≥2.

Figure 13:
FIG. 13 is a schematic diagram of a manufacturing process of a display panel according to an embodiment.

For example, as shown in FIG. 13, a layer of electrode material may be deposited on the first substrate 21 by coating, magnetron sputtering, thermal evaporation or PECVD to obtain the first electrode layer. The first electrode layer may include n first electrodes 01, and in the example shown in FIG. 1, n equals to 3.

Step 1202: forming a second electrode layer on a second substrate.

For example, a layer of electrode material may be deposited on the second substrate 22 by coating, magnetron sputtering, thermal evaporation, or PECVD to obtain the second electrode layer.

Step 1203: processing the second electrode layer by one patterning process to obtain an electrode pattern including n second electrodes insulated from each other.

Figure 14:
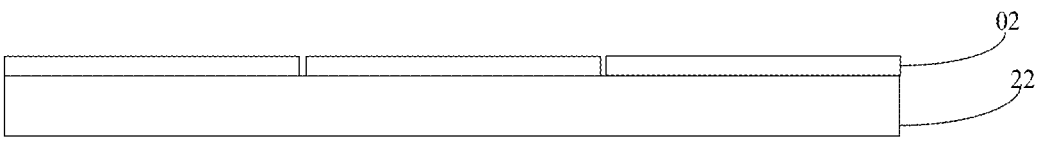
FIG. 14 is a schematic diagram of a manufacturing process of another display panel according to an embodiment.

The one patterning process includes: photoresist coating, exposure, development, etching, and photoresist stripping. As shown in FIG. 14, the electrode pattern Z obtained in the step 1203 may include n second electrodes 02.

Step 1204: forming n first adhesives on the first electrode layer in regions corresponding to n retaining walls.

For example, n first adhesives may be formed in regions of the first electrode layer where n retaining walls are to be formed. The first adhesive may be a photoresist, and the manner of forming the first adhesives may be exposure and development.

For example, a photoresist may be coated on the first electrode layer, and then the photoresist is exposed by using a mask to form a fully exposed region and a non-exposed region of the photoresist. After a development process, the photoresist in the fully exposed region is removed, and the photoresist in the non-exposed regions is retained, thereby obtaining n first adhesives.

Step 1205: forming a retaining wall on each of the first adhesives, n retaining walls formed in one-to-one correspondence with the n first electrodes, each of the retaining walls being annular and located on the first electrode corresponding to the retaining wall, and forming a receiving recess with the corresponding retaining wall.

Figure 15:
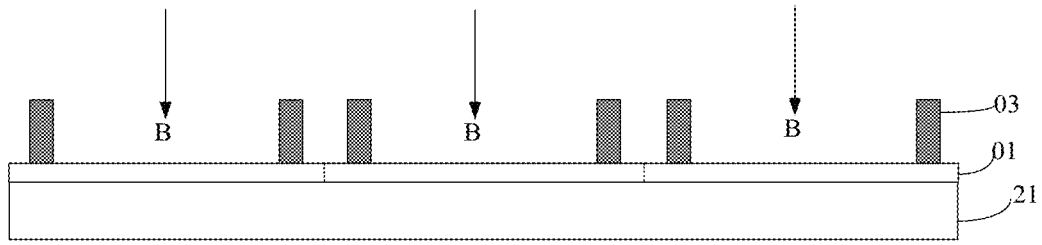
FIG. 15 is a schematic diagram of a manufacturing process of still another display panel according to an embodiment.

As shown in FIG. 15, an insulating material layer may be formed on the first substrate on which the n first adhesives are formed, and then the insulating material layer is processed by one patterning process to obtain a retaining wall 03 on each of the first adhesives (not shown in FIG. 15). Each of the retaining walls 03 forms a receiving recess B with the first electrode 01 corresponding to the retaining wall 03.

Step 1206: injecting a target liquid into each of the receiving recesses.

Figure 16:
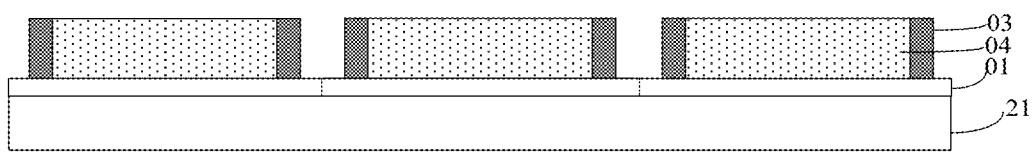
FIG. 16 is a schematic diagram of a manufacturing process of still another display panel according to an embodiment.

As shown in FIG. 16, the target liquid can be injected into the n receiving recesses.

Step 1207: forming a second adhesive on each of the retaining walls.

The process of forming the n second adhesives may refer to the process of forming the n first adhesives, which will not be described herein. After the step 1207 is completed, a second adhesive is formed on each of the retaining walls.

Step 1208: disposing the second substrate, on which the n second electrodes are formed, on the first substrate on which the n second adhesives are formed, so that the n second electrodes seal the n receiving recesses on the first substrate one by one to form n sealed cavities, each sealed cavity filled with the target liquid, and the n second electrodes being located between the first substrate and the second substrate.

The particles in the target liquid in each sealed cavity are used to form photonic crystals having different lattice spacing under the effect of different electric fields formed between the first electrode and the second electrode that form the sealed cavity.

After the second substrate on which the n second electrodes are formed is disposed on the n second adhesives, a display panel as shown in FIG. 10 can be obtained.

In summary, in the pixel structure of the display panel manufactured by the method according to the embodiment, the first electrode, the second electrode and the retaining wall enclose a sealed structure or a sealed cavity, and the sealed structure contains or includes a target liquid. The particles in the target liquid can form photonic crystals with different lattice spacing under the effect of an electric field, and the wavelengths of the light diffracted by the photonic crystals with different lattice spacing are different, so that the color of the light emitted by each pixel structure may be enriched.

Figure 17:
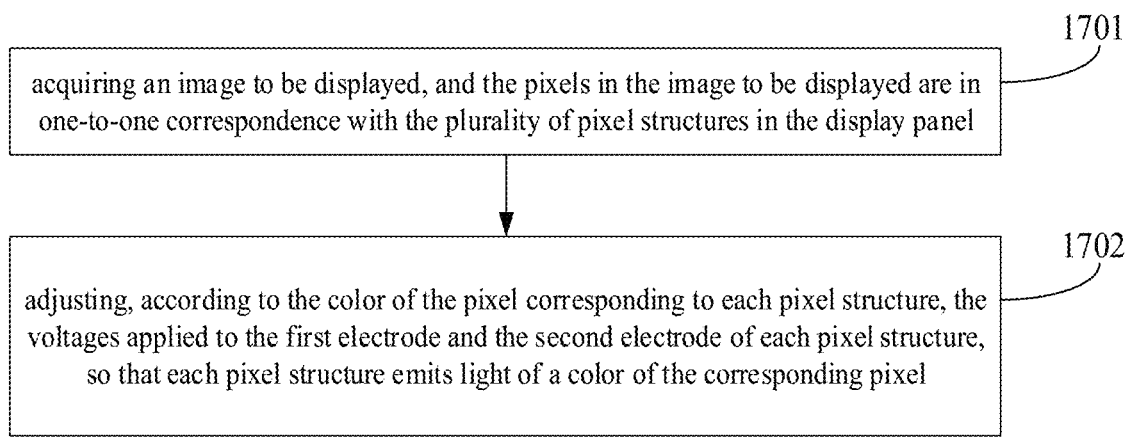
FIG. 17 is a flowchart of a method for controlling a display panel according to an embodiment.

FIG. 17 is a flowchart of a method for controlling a display panel according to an embodiment. The method is performed by a control device of a display panel, and the display panel may be a display panel shown in FIG. 9 or FIG. 10. As shown in FIG. 17, the control method of the display panel includes:

Step 1701: acquiring an image to be displayed, and the pixels in the image to be displayed are in one-to-one correspondence with the plurality of pixel structures in the display panel;

Step 1702: adjusting, according to the color of the pixel corresponding to each pixel structure, the voltages applied to the first electrode and the second electrode of each pixel structure, so that each pixel structure emits light of a color of the corresponding pixel.

That is, when it is required to control the display panel to display an image, the control device of the display panel can control each pixel structure to emit light of one color to a same side of the display panel, so that the light emitted by a pixel structure forms the corresponding pixel in the image.

Optionally, before step 1702, the control device of the display panel may further determine a display side of the display panel, where the display side may be set by a user using the control device of the display panel, or the display side is preset by the control device of the display panel. The display side of the display panel may include any side of the display panel. For example, the display side may include: a side where the first electrode is located, or a side where the second electrode is located, or both the side where the first electrode is located and the side where the second electrode is located. Here, after the voltages applied to the first electrode and the second electrode of each pixel structure are adjusted in step 1702, each pixel structure may emit light of a color of the pixel corresponding to the pixel structure to the display side. The display side of the display panel is caused to display the image, thereby realizing display at the display side of the display panel. Since the display side may be on either side of the display panel, the user can view the image displayed on the display panel on either side of the display panel, thereby enriching the function of the display panel.

In summary, in the method according to the embodiment, the pixels in the image to be displayed are in one-to-one correspondence with the pixel structures, and according to the color of the pixel corresponding to each pixel structure, the voltages applied to each of the first electrodes and each of the second electrodes are adjusted, causing each pixel structure to emit light having a color of the corresponding pixel, and achieving control of the display panel to display an image.

Figure 18:
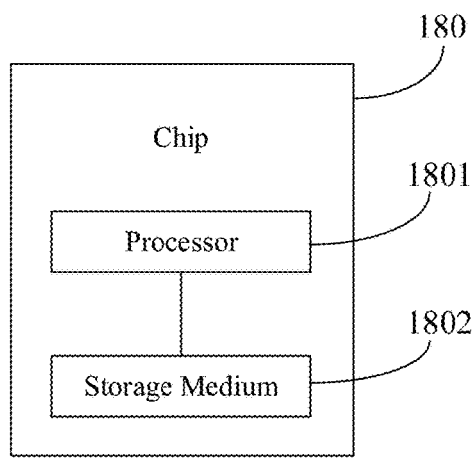
FIG. 18 is a schematic structural diagram of a control device for a display panel according to an embodiment.

FIG. 18 is a schematic structural diagram of a chip according to an embodiment. The control device of the display panel may include the chip. The display panel may be a display panel shown in FIG. 9 or FIG. 10. As shown in FIG. 18, the chip 180 may include a processor 1801 and a storage medium 1802.

The storage medium 1802 is configured to store computer instructions suitable for execution by the processor, and when executed by the processor 1801, the computer instructions are used to implement the method as shown in FIG. 17.

In summary, in the chip according to the embodiment, the processor corresponds the pixels in the image to be displayed to the pixel structures respectively, and adjusts, according to the color of the pixel corresponding to each pixel structure, voltages applied to each of the first electrodes and each of the second electrodes of the pixel structures to converge the light emitted by each of the pixel structures into light having a color of the corresponding pixel, thereby implementing control of the display panel to display the image.

Figure 19:
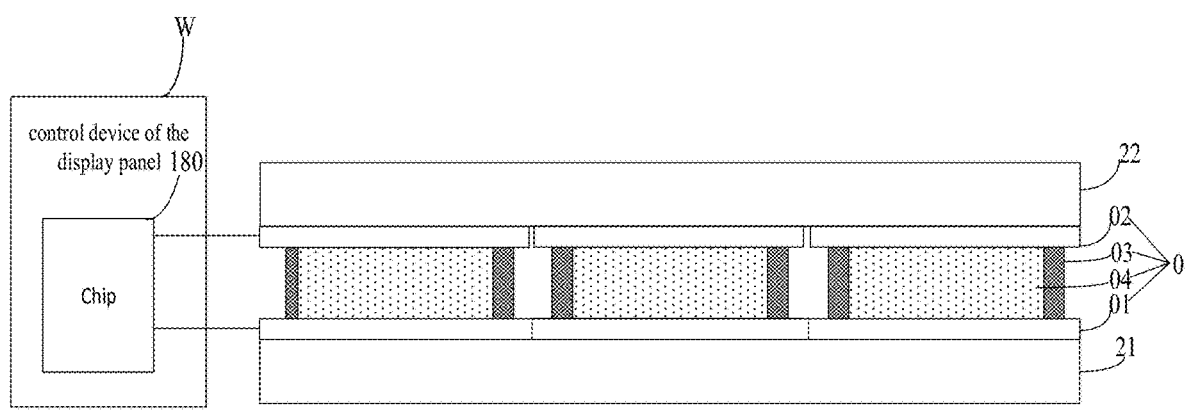
FIG. 19 is a schematic structural diagram of a display device according to an embodiment.

FIG. 19 is a schematic structural view of a display device according to an embodiment. As shown in FIG. 19, the display device may include: a display device W, and a display panel shown in FIG. 9. Optionally, the display panel in the display device according to the embodiment may also be a display panel shown in FIG. 10. The control device 180 of the display panel may include the chip 180 shown in FIG. 18.

The chip 180 may be electrically connected to both the first electrode 01 and the second electrode 02 of each pixel structure in the display panel. FIG. 19 only illustrates the electrical connections of the chip 180 with the first electrode 01 and the second electrode 02.

In summary, in the pixel structure of the display device according to the embodiment, the first electrode, the second electrode and the retaining wall enclose a sealed cavity, and the target liquid is contained in the sealed cavity. The particles in the target liquid can form photonic crystals with different lattice spacing under the action of an electric field, and the wavelengths of the light diffracted by the photonic crystals with different lattice spacing are different, so that the color of the light emitted by each pixel structure can be enriched.

The embodiment further provides a storage medium having stored therein computer instructions suitable for execution by a processor, the computer instructions when executed by the processor implementing the method shown in FIG. 17.

In some embodiments, the display panel may comprise different types of pixel structures. The pixel structures disclosed above may only be a subset of all pixel structures of the display panel. The display panel may further comprise a plurality of pixel structures of a different type; wherein each of the pixel structures of the different type is selected from a group consisting of: micro-led, mini-led, E-ink, LCD and OLED. In one example, the display panel may comprise a first region formed of pixel structures as disclosed above, and a second region formed of pixel structures of micro-led.

It should be noted that the embodiments of the method may be mutually referenced with the embodiments of corresponding pixel structure, the display panel, and the display device. The sequence of the steps of the embodiments of the method can be appropriately adjusted, and the steps may be correspondingly added or deleted according to the situation. Any person skilled in the art can easily think of variations or modifications within the scope of the disclosure.

Various embodiments and/or examples are disclosed to provide exemplary and explanatory information to enable a person of ordinary skill in the art to put the disclosure into practice. Features or components disclosed with reference to one embodiment or example are also applicable to all embodiments or examples unless specifically indicated otherwise.

Although the disclosure is described in combination with specific embodiments, it is to be understood by the person skilled in the art that many changes and modifications may be made and equivalent replacements may be made to the components without departing from a scope of the disclosure. Embodiments may be practiced in other specific forms. The described embodiments are to be considered in all respects only as illustrative and not restrictive.

The invention claimed is:

1. A display panel, comprising a plurality of pixel structures, each of the pixel structures comprising:
    a first electrode being a transparent electrode;
    a second electrode in substantially parallel arrangement with respect to the first electrode;
    a retaining wall between the first electrode and the second electrode, and enclosing a sealed cavity together with the first electrode and the second electrode; and
    a target liquid in the sealed cavity containing a plurality of particles, and the plurality of particles being configured to form photonic crystals with different lattice spacings under an action of different electric fields between the first electrode and the second electrode, wherein the plurality of particles are configured to be positionally movable under an electric field force towards a side of the first electrode or the second electrode to form the photonic crystals with the different lattice spacings such that wavelengths of light obtained by diffraction on the photonic crystals with the different lattice spacings are different, in case that the plurality of particles move towards the second electrode under the electric field force, the lattice spacings of photonic crystals on the side of the first electrode increase, and the lattice spacings of photonic crystals on the side of the second electrode decrease such that a color of light diffracted on the side of the second electrode changes.

2. The display panel according to claim 1, wherein the particles comprise at least one of the following: monodisperse particles, ferroferric oxide nanoparticles, titanium dioxide nanoparticles, or ferroferric oxide nanoparticles coated with titanium dioxide.

3. The display panel according to claim 1, wherein the target liquid comprises propylene carbonate or water as a solvent.

4. The display panel according to claim 1, wherein the particles are charged particles.

5. The display panel according to claim 1, wherein the second electrode is a transparent electrode.

6. The display panel according to claim 1, wherein a mass fraction of the particles in the target liquid ranges from 2.5% to 25%.

7. The display panel according to claim 1, wherein the target liquid comprises a suspension of ferroferric oxide nanoparticles in propylene carbonate, with a mass fraction of approximately 5%.

8. The display panel according to claim 1, wherein the target liquid comprises a suspension of ferroferric oxide nanoparticles coated with titanium dioxide in propylene carbonate.

9. The display panel according to claim 8, wherein a mass fraction of the ferroferric oxide nanoparticles coated with titanium dioxide in the suspension is in a range of 3% to 8%.

10. The display panel according to claim 1, further comprising a plurality of pixel structures of a different type; wherein each of the pixel structures of the different type is selected from a group consisting of: micro-led, mini-led, E-ink, LCD and OLED.

11. The display panel according to claim 1, wherein the retaining wall is of a same material as black matrix.

12. The display panel according to claim 1, wherein the retaining wall is of a material that is one or a combination selected from a group consisting of: Chromium (Cr), carbon black, and black porous resin composition having Titanium dioxide particles.

13. The display panel according to claim 1, wherein the retaining wall has a cross-sectional shape selected from a group consisting of: a rectangle, a trapezoid, an inverted trapezoid, and an area with stepped sides.

14. The display panel according to claim 1, further comprising:
a first substrate and a second substrate opposite to each other;
wherein the plurality of pixel structures are disposed between the first substrate and the second substrate.

15. The display panel according to claim 14, wherein first electrodes of the pixel structures in the display panel are an integrated electrode; and any two of second electrodes are insulated from each other.

16. A method of controlling a display panel, wherein the method is performed by a control device of the display panel, the display panel being the display panel of claim 14, the method comprising:
obtaining an image to be displayed, wherein the pixels in the image to be displayed are in one-to-one correspondence with the plurality of pixel structures in the display panel; and
adjusting voltages applied to the first electrode and the second electrode in each of the pixel structures according to a color of a pixel corresponding to each pixel structure.

17. A method of manufacturing a display panel, the display panel comprising a plurality of pixel structures, the method comprising:
providing a first electrode and a second electrode, at least one of the first electrode and the second electrode being a transparent electrode;
forming a retaining wall on the first electrode, wherein the retaining wall and the first electrode together form a receiving recess;
injecting a target liquid into the receiving recess; and
placing the second electrode on the retaining wall to seal the receiving recess and thereby forming a sealed cavity, and the target liquid being within the sealed cavity;
wherein the target liquid contains a plurality of particles, the plurality of particles are configured to form photonic crystals with different lattice spacings under an action of different electric fields between the first electrode and the second electrode, the plurality of particles are configured to be positionally movable under an electric field force towards a side of the first electrode or the second electrode to form the photonic crystals with the different lattice spacings such that wavelengths of light obtained by diffraction on the photonic crystals with the different lattice spacings are different, in case that the plurality of particles move towards the second electrode under the electric field force, the lattice spacings of photonic crystals on the side of the first electrode increase, and the lattice spacings of photonic crystals on the side of the second electrode decrease such that a color of light diffracted on the side of the second electrode changes.

18. The method according to claim 17, wherein the target liquid comprises a suspension of ferroferric oxide nanoparticles in propylene carbonate, with a mass fraction of approximately 5%.

19. The method according to claim 17, wherein the target liquid comprises a suspension of ferroferric oxide nanoparticles coated with titanium dioxide in propylene carbonate.

20. The method according to claim 19, wherein a mass fraction of the ferroferric oxide nanoparticles coated with titanium dioxide in the suspension is in a range of 3% to 8%.

* * * * *